United States Patent
Sirieix et al.

(10) Patent No.: US 12,050,955 B2
(45) Date of Patent: Jul. 30, 2024

(54) INLAY FOR ELECTRONIC DOCUMENT, METHOD FOR PRODUCING AN ELECTRONIC DOCUMENT COMPRISING SUCH AN INLAY, AND ELECTRONIC DOCUMENT OBTAINED

(71) Applicant: IDEMIA FRANCE, Courbevoie (FR)

(72) Inventors: Laurent Sirieix, Courbevoie (FR); Jean-François Deprun, Courbevoie (FR); Chase Liu, Courbevoie (FR)

(73) Assignee: IDEMIA FRANCE, Courbevoie (FR)

( * ) Notice: Subject to any disclaimer, the term of this patent is extended or adjusted under 35 U.S.C. 154(b) by 0 days.

(21) Appl. No.: 18/336,366

(22) Filed: Jun. 16, 2023

(65) Prior Publication Data

US 2023/0409865 A1 Dec. 21, 2023

(30) Foreign Application Priority Data

Jun. 16, 2022 (FR) ...................... 22 05916

(51) Int. Cl.
G06K 19/077 (2006.01)

(52) U.S. Cl.
CPC . G06K 19/07783 (2013.01); G06K 19/07722 (2013.01); G06K 19/07794 (2013.01)

(58) Field of Classification Search
CPC ... G06K 19/07745; G06K 19/077; H01Q 1/22
USPC ....................................... 235/492
See application file for complete search history.

(56) References Cited

U.S. PATENT DOCUMENTS

| | | | |
|---|---|---|---|
| 2017/0220919 A1 | 8/2017 | Gragnic et al. | |
| 2019/0303738 A1* | 10/2019 | Launay | G06K 19/07745 |
| 2023/0086189 A1* | 3/2023 | Finn | G06K 19/07769 |
| | | | 235/488 |
| 2023/0206021 A1* | 6/2023 | Choo | G06K 19/07775 |
| | | | 235/492 |

(Continued)

FOREIGN PATENT DOCUMENTS

| | | |
|---|---|---|
| EP | 2 178 032 A1 | 4/2010 |
| FR | 3 026 530 A1 | 4/2016 |

(Continued)

OTHER PUBLICATIONS

French Preliminary Search Report & Written Opinion Issued Jan. 19, 2023 in French Application 22 05916 filed on Jun. 16, 2022 (with English Translation of Categories of Cited Documents), 10 pages.

*Primary Examiner* — Allyson N Trail
(74) *Attorney, Agent, or Firm* — Oblon, McClelland, Maier & Neustadt, L.L.P.

(57) ABSTRACT

Inlay (40) comprising a substrate (41) and a first zigzag portion (42) formed of a metal wire (421) embedded in an upper face (43) of the substrate (41), the first zigzag portion (42) comprising, alternately, rectilinear segments (422) and bends (423), at least one of the rectilinear segments (422) of the first zigzag portion (42) being disposed, at least in part, in a zone (45) of the upper face (43) of the substrate (41) configured to form a spotface of a cavity of an electronic document, and the inlay (40) comprising a connection wire (47) configured to join together at least the rectilinear segments (422) of the first zigzag portion (42). Method for producing an electronic document (1) comprising such an inlay (40), and electronic document (1).

20 Claims, 4 Drawing Sheets

(56) References Cited

U.S. PATENT DOCUMENTS

2024/0070433 A1* 2/2024 Alexandre ........... C25D 11/022

FOREIGN PATENT DOCUMENTS

| FR | 3 062 225 A1 | 7/2018 |
| FR | 3 093 228 A1 | 8/2020 |

* cited by examiner

A)

B)

C)

D)

INLAY FOR ELECTRONIC DOCUMENT, METHOD FOR PRODUCING AN ELECTRONIC DOCUMENT COMPRISING SUCH AN INLAY, AND ELECTRONIC DOCUMENT OBTAINED

The invention relates to an inlay, for an electronic document, which comprises at least one substrate and a zigzagging metal wire embedded in an upper face of the substrate.

An inlay denotes a layer configured to be inserted within a thickness of a body of an electronic document.

The invention also relates to a method for producing an electronic document comprising such an inlay, for example a card, such as a smart card, or an identity document.

More particularly, the invention relates to a method for producing an electronic document comprising a body, within a thickness of which is inserted an inlay, having a cavity open at a face of the body, and a module inserted into the cavity.

In such a document, the body generally comprises an inlay having a wire, for example forming an antenna, of which two ends open into the cavity, and the module conventionally comprises a microprocessor and two connection terminals which are connected electronically on the one hand to the microprocessor and on the other hand to the ends of the wire.

Such an inlay comprises, for example, a substrate and the wire, which forms the antenna for example, and is embedded in the substrate. Such an inlay is produced, for example, by laying the conductive metal wire on the substrate by means of a tool, such as a sonotrode, moving over the substrate and distributing the wire. The wire is embedded in the substrate by means of ultrasonic vibrations that are transmitted to the wire from the tool. The vibrations are transmitted perpendicularly to the substrate in order to embed the wire within the thickness of the substrate. The wire is surrounded, for example, by an insulating sheath which is heated, for example for a very short time, in order to improve the adherence of the sheath to the substrate. The tool is controlled in order to define the trajectory of deposition of the wire. It is thus possible to wind the wire in several turns and/or deposit it along lines of various shapes, for example a sinuous line, such as a zigzagging line, which comprises, alternately, rectilinear segments and bends.

Within an electronic document, the inlay is interposed between at least two layers, which are thus disposed on either side of the inlay, thus forming the body of the document. These at least two layers and the inlay are for example joined together by lamination.

Thereafter, the cavity is formed by machining, for example by milling; at least one of the layers is then machined, and in such a way that the ends of the wire open into a bottom of the cavity, in particular on a spotface of the cavity, also called a counterbore. However, several problems may arise during the machining of the cavity, the insertion of the module and the electrical connection between the module and the ends of the wire of the inlay.

For example, if the machining is not deep enough, poor contact may be established between the ends of the wire and the module, because a thickness of material, generally of plastic, may remain on the wire of the inlay.

Or for example if the machining is too deep, the machine tool, for example the milling cutter, may pull out some of the wire of the inlay. For this reason, a portion of the wire may be at considerable risk of being dislodged from the substrate in which it was initially embedded. When this portion of wire is dislodged, it positions itself randomly in the cavity. This creates a risk of malfunction of the electronic document. In particular, when the detached portion of wire is situated in the cavity, it may come into contact with conductive portions situated on an inner face of the module, for example current leads, thereby creating a not inconsiderable risk of short circuits. Similarly, when the dislodged portion of wire is located on a zone of contact with the connection terminals connected to the microprocessor, this results in an overthickness of wire, hence a zone of reduced contact.

In addition, during mechanical tests of such an electronic document, for example torsion tests, or during the life of the electronic document, a low connectivity generally leads to poor functioning of the electronic document.

These problems are thus due to various tolerances associated, for example, with the machining depth, the wire thickness of the inlay, the thickness of the various layers of materials constituting the electronic document, or the position of the inlay within the thickness of the body of the electronic document.

To reduce the risks of the wire being pulled out, the patent application published under the number FR3026530 describes an electronic document in which the ends of an antenna, which open out in the cavity, are arranged in a zigzag form, of which the rectilinear segments are inclined by approximately 6° with respect to an edge of the cavity.

Furthermore, the document FR3015733 describes a document in which a contact means is formed by a wire connected electrically to an end of an antenna and arranged in such a way that the wire develops from the end of the antenna to form a lace defining consecutive lines directed alternately in opposite directions and being further from the end of the antenna than the preceding line and being connected to the latter by a bend, the contact means being formed flush with the bottom of the cavity and comprising at least one first bend disposed outside of the cavity. Thus, irrespective of the direction of approach of a milling cutter, the latter will in the first instance machine peripheral lines furthest from the end of the antenna, thus reducing the risk of pulling out of the lines situated in proximity to the end of the antenna.

It has also been proposed to optimize the machining depth so that it is sufficiently deep to have good contact between the connection terminals of the module and the contact pads of the inlay, for example by suppressing the maximum of plastic on the wires of the inlay, but also sufficiently shallow so as not to pull out the wires of the inlay.

It is therefore an object of the present invention to at least partially remedy the aforementioned disadvantages, thereby possibly leading to other advantages.

To this end, according to a first aspect, an inlay is proposed comprising at least one substrate and at least one first zigzag portion formed of a metal wire embedded in an upper face of the substrate.

In the context of the present description, the qualifying terms "first" and "second" serve merely to distinguish between the elements that they qualify; they do not imply any order of these elements.

The first zigzag portion is disposed, at least in part, in a zone of the upper face of the substrate configured to form a spotface of a cavity.

Here, a zigzag wire denotes a wire which, for example, is deposited in successive back-and-forth runs, thus forming rectilinear segments that are connected to one another by bends that form loops. The rectilinear segments are for example parallel to one another, and two adjacent rectilinear segments are for example connected to each other by a portion that is typically curved, for example in an arc of a circle.

A zigzag wire makes it possible in particular to cover a larger surface area so as to establish an electrical contact with relatively little material.

The zigzag wire is made of copper, for example.

Here, therefore, the first zigzag portion comprises, alternately, rectilinear segments and bends, a bend connecting two successive rectilinear segments.

According to an advantageous feature of the invention, at least one of the rectilinear segments of the first zigzag portion is disposed, at least in part, in a zone of the upper face of the substrate configured to form a spotface of a cavity of an electronic document.

Moreover, according to another advantageous feature of the invention, the inlay comprises a connection wire configured to join together at least the rectilinear segments of the first zigzag portion.

The connection wire thus denotes a wire configured to electrically connect at least rectilinear segments of the first zigzag portion.

The connection wire is, for example, a wire distinct from the embedded metal wire.

The connection wire is therefore an electrically conductive wire, for example also metallic.

Such an inlay is, for example, configured to be used in a method as described below.

Such an inlay is thus configured to provide more reliable electrical contact between an inserted module and the wires of the inlay when they are assembled in an electronic document.

Such an arrangement improves resistance to pulling out of the wire of the inlay during the machining of the cavity.

Moreover, such an arrangement of the wires also provides better resistance of the inlay and even of the electronic document around the module during the life of the electronic document.

It is thus possible to reduce the constraints surrounding the production of the electronic document, by reducing the impact of the various production tolerances.

In one exemplary embodiment, the connection wire comprises a part which intersects at least the first zigzag portion outside a zone of the upper face of the substrate configured to form a deep part of the cavity.

That zone of the upper face of the substrate configured to form the deep part of the cavity is, for example, surrounded by that zone of the upper face of the substrate configured to form the spotface of the cavity.

In one exemplary embodiment, the connection wire comprises a part which intersects at least the first zigzag portion in a zone of the upper face of the substrate configured to be outside the cavity.

This is, for example, a zone of the substrate configured to remain covered by at least one layer when the inlay is assembled between layers in order to form a body of an electronic document.

In one embodiment, the connection wire comprises at least one part disposed next to the first zigzag portion.

For example, that part of the connection wire disposed next to the first zigzag portion comprises at least one end disposed in that zone of the upper face of the substrate configured to form the deep part of the cavity.

This part is thus configured to be cut during the machining of the cavity.

In one embodiment, the at least one of the rectilinear segments of the first zigzag portion forms an angle of between 80° and 100° with respect to a limit between that zone of the upper face of the substrate configured to form the spotface of the cavity and that zone of the upper face of the substrate configured to form the deep part of the cavity.

In one embodiment, the at least one of the rectilinear segments of the first zigzag portion comprises at least one end, called a first end, which extends in that zone of the upper face of the substrate configured to be outside the cavity.

In one embodiment, the at least one of the rectilinear segments of the first zigzag portion comprises an end, called a second end, which extends in that zone of the upper face of the substrate configured to form the deep part of the cavity.

In one embodiment, the inlay additionally comprises at least one second zigzag portion formed of metal wire, disposed, at least in part, in that zone of the upper face of the substrate configured to form the spotface of the cavity.

The second zigzag portion comprises, for example, all or some of the features of the first zigzag portion described above.

The first zigzag portion and at least the second zigzag portion can be formed from the same metal wire, or each can be formed from its own metal wire.

In other words, in one embodiment, the inlay comprises a metal wire comprising at least the first zigzag portion and the second zigzag portion.

For example, the metal wire of the inlay is then configured to provide by itself all connections of an electronic document; i.e. a single metal wire can for example comprise all the zigzag portions of the inlay.

In another exemplary embodiment, the inlay comprises at least two metal wires, each of the at least two metal wires comprising at least one zigzag portion, or indeed a single zigzag portion.

In one exemplary embodiment, the connection wire is additionally configured to join together at least the first zigzag portion and the second zigzag portion.

Thus, a single test can permit verification of all the connections.

Also proposed, according to another aspect, is a method for producing an electronic document, the method comprising:

A step of making available a body of the electronic document, the body comprising at least:
  an inlay, as described above; and
  at least one upper layer which covers the upper face of the substrate of the inlay, and a lower layer, the substrate of the inlay being disposed between the upper layer and the lower layer;

A step of forming a cavity in the body, comprising at least one step of machining at least the upper layer of the body by means of a machine tool, in which step the machine tool has a cutting direction forming an angle of between 80° and 100° with respect to a rectilinear segment of the first zigzag portion.

To limit risks of pulling out wire of the inlay, it is preferable that the machine tool, for example a milling cutter, potentially encounters a wire in the direction of the width of the latter, that is to say its diameter. In this case, cutting may be carried out.

An angle formed between the wire and the tool preferably remains within a value range for limiting a risk of the wire being pulled out.

By virtue of the presence of the connection wire, the number of cuts is not important, the zigzag portions being connected to one another by this connection wire.

Thus, according to an example of implementation of the method, the angle between the tool and a rectilinear segment of a zigzag portion is approximately 90 degrees, +/−10°.

In one example of implementation, the step of forming the cavity in the body comprises a step of forming a deep part of the cavity, in which step that zone of the upper face of the substrate configured to form the deep part of the cavity is machined.

According to one example, the second end of the at least one of the rectilinear segments of the first zigzag portion is then cut by the machine tool.

According to another example, the end of that part of the connection wire disposed next to the first zigzag portion is then cut by the machine tool.

In parallel, the rectilinear segments that have been cut remain connected by the connection wire. It is thus possible to increase the contact surface between the first zigzag portion of the inlay and a connection terminal of a module that will be inserted into the cavity according to different tolerances.

In one exemplary embodiment, the rectilinear segments of the first zigzag portion are disposed orthogonally to an edge between the spotface and the deep part of the cavity, that is to say forming an angle of between 80° and 100° with respect to the edge (i.e.)+/−10°.

Also proposed, according to another aspect, is an electronic document comprising:

A body, which comprises:
  a cavity hollowed out in a part of a thickness of the body, the cavity comprising a deep central part and a peripheral part, formed of a spotface, less deep than the deep part and surrounding the deep part, and
  an inlay comprising at least one substrate and at least one first zigzag portion formed of a metal wire embedded in an upper face of the substrate, the first zigzag portion comprising, alternately, rectilinear segments and bends, a bend connecting two successive rectilinear segments, the first zigzag portion forming a connection pad, exposed on the spotface, and the inlay comprising at least one connection wire joining together the rectilinear segments of the first zigzag portion,
A module inserted into the cavity and comprising at least one connection terminal in electrical contact with the first zigzag portion of the inlay.

Such an electronic document is, for example, a card, for example a smart card, for contact and/or contactless use (for example a dual-interface card).

The body of the electronic document complies, for example, with the current standards, in particular ISO 7810 and ISO 7816.

According to the standard ISO 7816, the body can have several formats, likewise standardized. Four standardized formats, known by the following designations (see in particular the standard ETSI TS 102 221 and the standard ISO 7816), are principally used:
  ID-1 having a length of 85.6 mm, a width of 54 mm, and a thickness of mm; this format is sometimes designated 1FF (for "first form factor");
  ID-000 (also called Plug-in UICC, or SIM GSM card) having a length of 25 mm, a width of 15 mm, and the same thickness of 0.76 mm; this format is sometimes designated 2FF (for "second form factor");
  Mini-UICC (sometimes also called SIM card), with a length of 15 mm, a width of 12 mm and the same thickness of 0.76 mm; this format is sometimes designated 3FF (for "third form factor");
  A fourth format, even smaller, called nano-SIM or 4FF (for "fourth form factor"), the body then measuring 12.3 mm×8.8 mm×0.67 mm.

The notions of length and width are defined here by reference to the orientation of the microcircuit.

The tolerances of all the bodies described here are of the order of 0.1 mm, or even mm.

In one embodiment, the cavity has an exposed surface with dimensions approximately equal to 13.2 mm×12 mm (+/−0.05 mm) for a cavity for receiving a secure element, for example a secure element configured to carry out a payment transaction according to the EMV standard (Europay, Mastercard and Visa, for example in its 4.3 version), or 16.3 mm×16.3 mm (+/−0.05 mm) for a cavity configured to receive a biometric sensor.

All other cavity dimensions may also be suitable.

The electronic document module comprises, for example, at least one support, also called a carrier film, or depending on the circumstances an insulating substrate, or vignette, or flexible plate.

The film comprises a face referred to as the outer face, since it is intended to be accessible from outside the electronic document equipped with this module, and a face referred to as the inner face, which is opposite the outer face and is intended to be oriented towards the interior of the cavity formed in the body in order to receive the module.

The outer face of the module comprises, for example, an external interface.

The external interface comprises, for example, external contact interfaces according to a well-defined configuration, for example as defined by ISO 7816.

The external interface can also comprise a sensor, for example a biometric sensor.

The inner face carries, for example, connection terminals connected electrically to at least part of the external interface of the outer face.

In addition, at least one connection terminal is configured to be in contact with a zigzag portion, forming a connection pad, of the inlay of the electronic document body.

The module also generally comprises a microprocessor, which is fixed on the inner face of the support.

The module complies, for example, with the standard ISO 7816.

Thus, when the module is inserted into the cavity, with the connection terminals in contact on the spotface, the microprocessor is situated in the deep part of the cavity.

The invention, in an exemplary embodiment, will be understood and its advantages will become clearer on reading the following detailed description, given by way of non-limiting examples, with reference to the accompanying drawings, in which:

The identical elements shown in the aforementioned figures are identified by identical reference numbers.

FIG. 1 illustrates schematically an electronic document 1.

Figure 1:
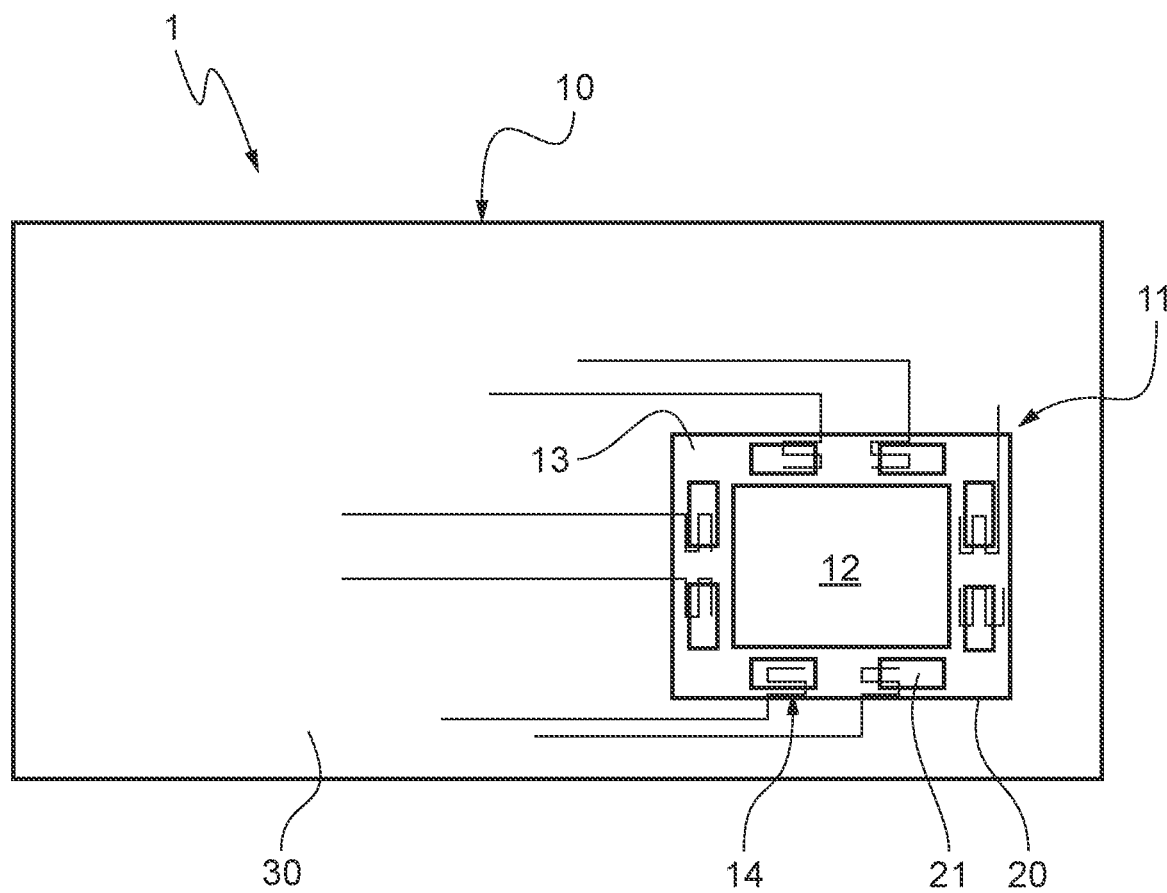
FIG. 1 shows schematically a traditional electronic document.

The electronic document 1 comprises, for example, a body 10.

The body 10 here comprises a cavity 11 hollowed out in a part of a thickness of the body.

The cavity 11 comprises a deep central part 12 and a spotface 13, which is less deep and surrounds the deep part 12.

The body 10 comprises, in the conventional manner, at least one connection pad 14, disposed on the spotface 13 and configured to come into electrical contact with a connection terminal 21 of a module 20 inserted into the cavity 11; a microprocessor of the module 20 then being disposed in the deep part 12 of the cavity.

For this, the connection pad 14 is generally formed in an inlay 30, laminated in the body.

An inlay denotes a layer configured to be inserted into a thickness of the body of an electronic document, and incidentally, where appropriate, an intermediate layer which is inserted into the thickness of the body of the electronic document.

This cavity thus makes it possible, for example, to position the module in the electronic document and to access the wires of the inlay, which is situated in the body, and thus connect the module electrically to the body of the document.

In such an electronic document, the cavity is generally produced by machining, for example by milling.

However, during the production of such an electronic document, several problems may arise, in particular the wires of the inlay being pulled out during the passage of the machine tool, or poor contact being established between the inlay and the module if the machining is not deep enough.

Figure 2:
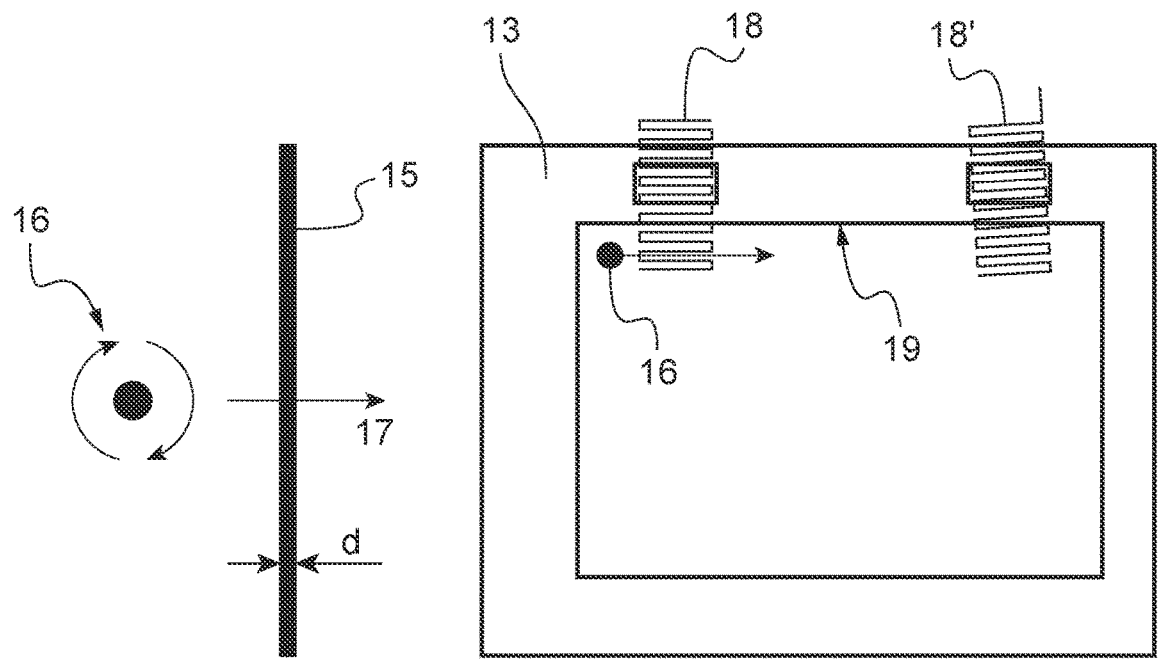
FIG. 2 shows schematically a movement of a machine tool with respect to a wire portion according to different configurations.
Figure 2:
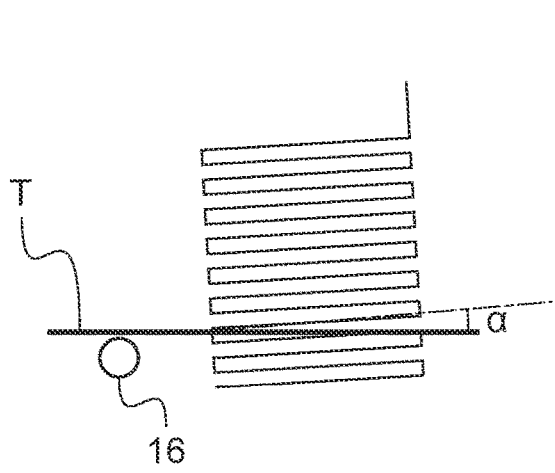
Figure 2:
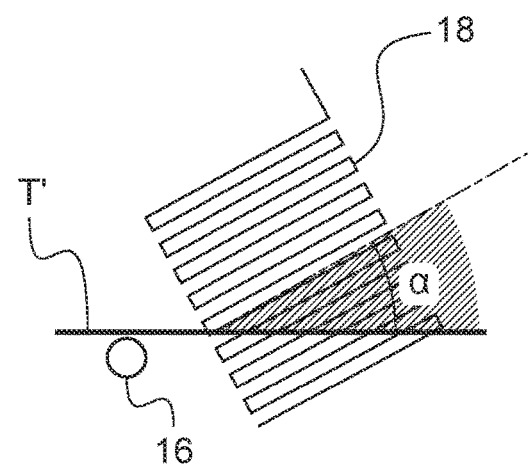

To limit problems of pulling out, it is considered preferable, as illustrated in FIG. 2 A), that the machine tool 16 approaches a wire 15 along the diameter d of the latter, as is indicated schematically by the arrow 17.

However, as is illustrated in FIG. 2 B), in practice a zigzag wire 18 forming a connection pad is disposed with its rectilinear segments disposed parallel to an edge 19 of the spotface 13, or at a slight angle α, such that the machine tool 16 is instead made to run along the length of the rectilinear segments.

FIG. 2 C) thus illustrates a machine tool 16 trajectory T having a slight angle α of a few degrees, for example equal to or less than 6°, to a rectilinear segment, whilst FIG. 2 D) thus illustrates a machine tool 16 trajectory T' having a large angle α, for example greater than 6°; for example approximately 35° to a rectilinear segment. In the latter case, a greater number of wires 18 may be pulled out, which generates a connection loss, and a reduction in the useful surface area of the connection pad.

Figure 3:
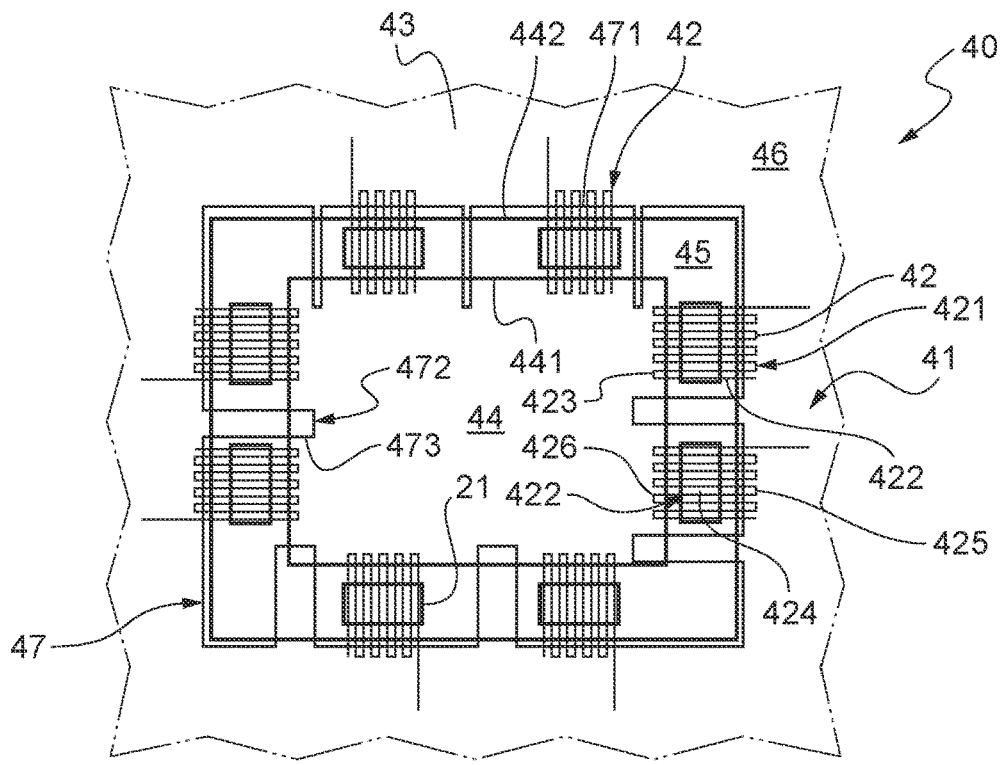
FIG. 3 shows a first exemplary embodiment of the invention.

FIG. 3 shows a detail of an inlay 40 according to a first exemplary embodiment of the invention.

The inlay 40 comprises at least one substrate 41.

The substrate 41 is formed, for example, of a sheet configured to be laminated with at least one other layer in order to form a card body.

It principally comprises an upper face 43, in which at least one metal wire is embedded.

The upper face 43 is initially considered plane.

The upper face 43 of the substrate 41 comprises several zones, delimited here by dotted lines for illustration:
- a central zone 44, which is configured to form a deep part of the cavity;
- a peripheral zone 45, which is configured to form a spotface of a cavity of an electronic document and which surrounds the central zone 44; and
- a zone 46, which is configured to be outside the cavity and which here surrounds the peripheral zone 45 and the central zone 44.

With a view to establishing connections to a module, the inlay 40 here also comprises at least one first zigzag portion 42 formed of a metal wire embedded in the upper face 43 of the substrate 41.

Said zigzag portion 42 is disposed, at least in part, in that zone 45 of the upper face 43 of the substrate 41 configured to form a spotface of a cavity.

Said zigzag portion 42 comprises a wire 421, which is deposited by successive back-and-forth runs; it thus forms rectilinear segments 422 that are connected to one another by bends 423, which form loops. The rectilinear segments 422 are here parallel to one another.

In the present exemplary embodiment, at least one of the rectilinear segments 422 comprises a part 424 disposed in the zone 45 configured to form the spotface of a cavity, and also a first end 425 which extends in the zone 46 configured to be outside the cavity, and a second end 426 which extends in the zone 44 configured to form the deep part of the cavity.

Here, the rectilinear segments 422 are disposed at an angle of between 80° and 100° (i.e. 90°+/−10°; i.e. substantially orthogonally) with respect to a limit 441 between the zone 44 and the zone 45, and also with respect to a limit 442 between the zone 45 and the zone 46.

The limit 441 represents a future edge 19 between the spotface and the deep part of the cavity, and the limit 442 represents a future edge between the spotface and a part outside the cavity when the inlay is laminated in a body and machined to form the cavity.

In the present exemplary embodiment, the inlay has a total of eight zigzag portions, which all have the same features as the first zigzag portion 42.

The eight zigzag portions are regularly disposed, at least in part, in the zone 45 configured to form the spotface of the cavity.

Here, the eight zigzag portions are disposed in pairs along four sides of a rectangle so as to form a rectangular cavity.

In FIG. 3, the inlay 40 additionally comprises a connection wire 47.

The connection wire 47 is configured to join together at least the rectilinear segments 422 of the first zigzag portion 42.

For this, the connection wire 47 comprises a part 471 which intersects at least the first zigzag portion 42 outside the zone 44 configured to form a deep part of the cavity.

This makes it possible to limit or even eliminate risks of the part 471 being cut when the inlay is machined to form the deep part of the cavity.

In the present exemplary embodiment, the part 471 which intersects the first zigzag portion 42 is even situated in the zone 46 configured to be outside the cavity.

It is thus situated in a zone that is not theoretically machined.

For example, this is a zone of the substrate that is configured to remain covered by at least one layer when the inlay is assembled between layers in order to form a body of an electronic document.

The connection wire here also comprises at least one part 472 which is disposed next to the first zigzag portion 42, and which comprises at least one end 473 disposed in the zone 44 configured to form the deep part of the cavity.

This part is thus configured to be cut during the machining of the cavity.

In addition, in the present exemplary embodiment, all eight zigzag portions are connected by the connection wire 47.

Thus, the connection wire 47 comprises eight parts 471 and eight parts 472 so that, once their end 473 is cut, the eight zigzag portions are isolated from one another, but the connections of their rectilinear segments to one another remain provided by the parts 471.

Figure 4:
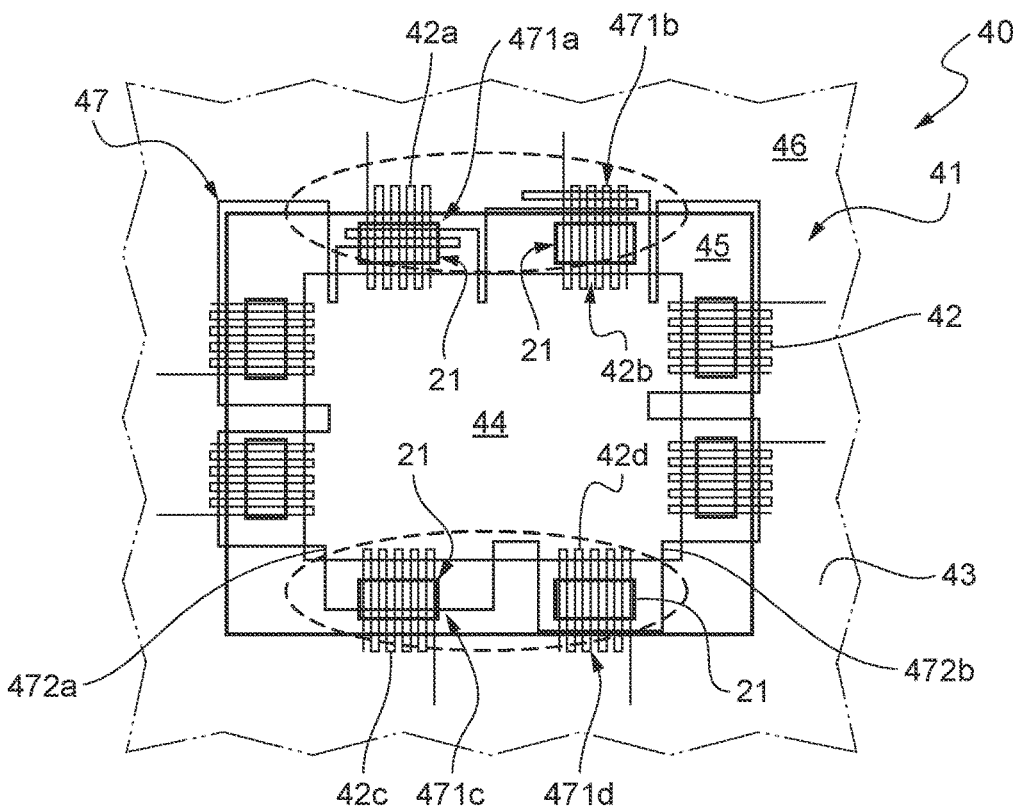
FIG. 4 shows a second exemplary embodiment of the invention.

The exemplary embodiment of FIG. 4 differs from that of FIG. 3 in terms of an arrangement of some parts 471 of the connection wire 47, which each intersect one of the zigzag portions, and in terms of an arrangement of some parts 472, which nonetheless comprise at least one end 473 disposed in the zone 44 configured to form the deep part of the cavity.

The course of the connection wire 47 is for example optimized here in order to obtain a maximum number of connections.

Thus, for example, the parts 472a and 472b here form fewer meanders than in FIG. 3.

For example, the part 471a, the part 471c and the part 471d are here disposed in the zone 45 configured to form a spotface, and no longer in the zone 46 like the part 471b. Moreover, the part 471a and the part 471b here comprise a zigzag of which the rectilinear segments are disposed orthogonally to the rectilinear segments of the corresponding zigzag portion 42a or 42b.

For the part 471a, the rectilinear segments are then configured to be disposed parallel to a trajectory of a machine tool.

Furthermore, the part 471a and the part 471c are additionally situated so as to be in contact with connection terminals 21 of a module when the corresponding electronic document is produced, whilst the part 471d is configured to pass around a corresponding future connection terminal 21.

Thus, proceeding from such an inlay 40, for example as shown in FIG. 3 or FIG. 4, an electronic document 1 is produced according to a method comprising for example the following steps:
A step of making available a body 10 of the electronic document, the body comprising at least:
an inlay 40, as described above; and
at least one upper layer, which covers the upper face of the substrate of the inlay, and a lower layer, the substrate of the inlay being disposed between the upper layer and the lower layer;
A step of forming a cavity 11 in the body 10, comprising at least a step of machining at least the upper layer of the body by means of a machine tool 16, in which step the machine tool 16 has a cutting direction forming an angle α of between 80° and 100° with respect to a rectilinear segment 422 of the first zigzag portion 42.

Here, the step of forming the cavity additionally comprises a step of forming the deep part of the cavity, in which step the zone 44 of the substrate is machined.

Thus, during this step, the second ends 426 of the rectilinear segments 422 of the zigzag portions 42 are cut, and also the ends 473 of the parts 472 of the connection wire 47.

However, the rectilinear segments remain connected by the connection wire 47 by virtue of the corresponding parts 471.

Figure 5:
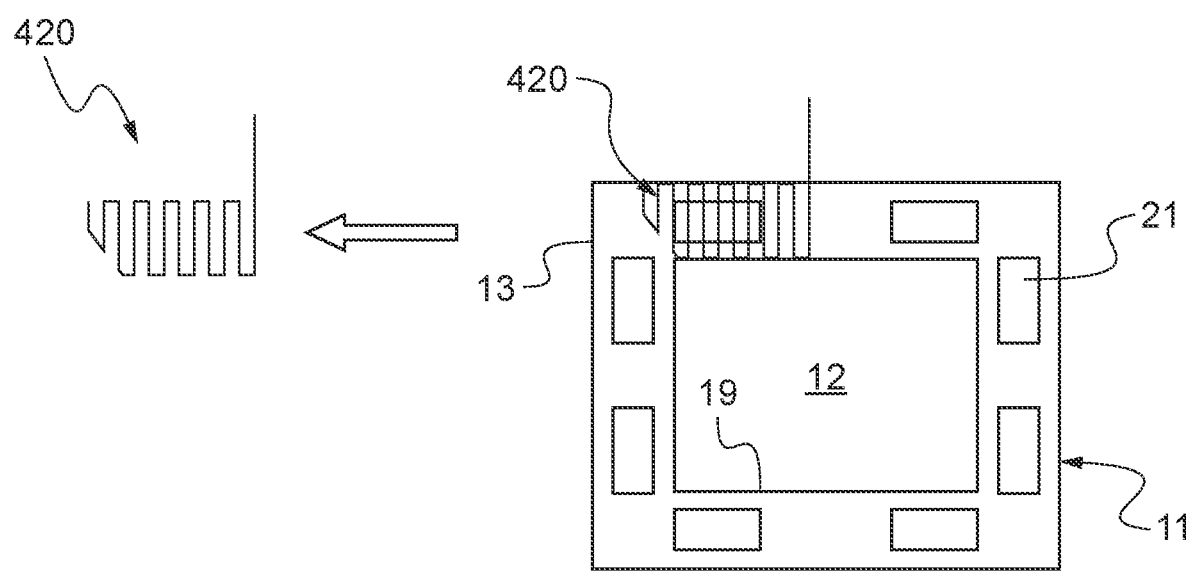
FIG. 5 shows an alternative embodiment of the invention.

As is illustrated in FIG. 5, it is thus possible to increase the contact surface area between a zigzag portion 420 of the inlay and a connection terminal 21 of a module which will be inserted into the cavity according to different tolerances.

As is illustrated in this figure, the zigzag portion can thus extend more widely beyond where the connection terminal 21 is situated.

This figure also shows that the rectilinear segments of the zigzag portion 420 are disposed orthogonally to an edge 19 between the spotface 13 and the deep part 12 of the cavity 11, that is to say forming an angle of between 80° and 100° with respect to the edge (i.e. 90°+/−10°).

Finally, this figure shows, by way of example, the zigzag portion 420 according to another exemplary embodiment.

For example, the course of the wire of the zigzag portions is optimized in order to obtain maximum connection. Its design will thus take account of the various tolerances, for example the location of the zigzag portions, the milling, the arrangement of the module, the different wires, etc.

Such a method thus makes it possible to produce an electronic document comprising:
A body 10, which comprises:
a cavity 11 hollowed out in a part of a thickness of the body, the cavity comprising a deep central part 12 and a peripheral part, formed of a spotface 13, less deep than the deep part and surrounding the deep part, and
an inlay 40 comprising at least one first zigzag portion 42, forming a connection pad, exposed on the spotface 13, and comprising at least one connection wire 47 joining together the rectilinear segments 422 of the first zigzag portion, and
A module 20 inserted into the cavity 11 and comprising at least one connection terminal 21 in electrical contact with the first zigzag portion 42 of the inlay 40.

Such an electronic document is, for example, a card, for example a smart card, for contact and/or contactless use (for example a dual-interface card).

The electronic document module comprises, for example, at least one support, also called a carrier film, or depending on the circumstances an insulating substrate, or vignette, or flexible plate, etc.

The film comprises a face referred to as the outer face, since it is intended to be accessible from outside the electronic document equipped with this module, and a face referred to as the inner face, which is opposite the outer face and is intended to be oriented towards the interior of the cavity formed in the body in order to receive the module.

The outer face of the module comprises, for example, an external interface.

The external interface comprises, for example, external contact interfaces according to a well-defined configuration, for example as defined by the standard ISO 7816.

The external interface can also comprise a sensor, for example a biometric sensor.

The module also generally comprises a microprocessor, which is fixed on the inner face of the support thus disposed in the deep part of the cavity.

The invention claimed is:

1. An inlay comprising:
at least one substrate and at least one first zigzag portion formed of a metal wire embedded in an upper face of the at least one substrate, the at least one first zigzag portion including, alternately, rectilinear segments and bends, a bend connecting two successive rectilinear segments, at least one of the rectilinear segments of the at least one first zigzag portion being disposed, at least in part, in a zone of the upper face of the substrate configured to form a spotface of a cavity of an electronic document, and the inlay including a connection wire configured to join together at least the rectilinear segments of the at least one first zigzag portion.

2. The inlay according to claim 1, wherein the connection wire comprises a part which intersects at least the at least one first zigzag portion outside a zone of the upper face of the substrate configured to form a deep part of the cavity.

3. The inlay according to claim 2, wherein the connection wire further comprises at least one part disposed next to the at least one first zigzag portion, and the at least one part of the connection wire disposed next to the at least one first zigzag portion further comprises at least one end disposed in the zone of the upper face of the substrate configured to form the deep part of the cavity.

4. The inlay according to claim 3, wherein the at least one of the rectilinear segments of the at least one first zigzag portion forms an angle of between 80° and 100° with respect to a limit between the zone of the upper face of the substrate configured to form the spotface of the cavity and the zone of the upper face of the substrate is configured to form the deep part of the cavity.

5. The inlay according to claim 3, wherein the at least one of the rectilinear segments of the at least one first zigzag portion comprises a second end, which extends in the zone of the upper face of the substrate configured to form the deep part of the cavity.

6. The inlay according to claim 2, wherein the connection wire further comprises a part which intersects at least the at least one first zigzag portion in a zone of the upper face of the substrate configured to be outside the cavity.

7. The inlay according to claim 3, wherein the connection wire further comprises a part which intersects at least the at least one first zigzag portion in a zone of the upper face of the substrate configured to be outside the cavity.

8. The inlay according to claim 2, wherein the at least one of the rectilinear segments of the at least one first zigzag portion forms an angle of between 80° and 100° with respect to a limit between the zone of the upper face of the substrate configured to form the spotface of the cavity and the zone of the upper face of the substrate is configured to form the deep part of the cavity.

9. The inlay according to claim 8, wherein the at least one of the rectilinear segments of the at least one first zigzag portion comprises a second end, which extends in the zone of the upper face of the substrate configured to form the deep part of the cavity.

10. The inlay according to claim 8, wherein the connection wire further comprises a part which intersects at least the at least one first zigzag portion in a zone of the upper face of the substrate configured to be outside the cavity.

11. The inlay according to claim 2, wherein the at least one of the rectilinear segments of the at least one first zigzag portion comprises a second end, which extends in the zone of the upper face of the substrate configured to form the deep part of the cavity.

12. The inlay according to claim 1, wherein the connection wire further comprises a part which intersects at least the at least one first zigzag portion in a zone of the upper face of the substrate configured to be outside the cavity.

13. The inlay according to claim 12, wherein the at least one of the rectilinear segments of the at least one first zigzag portion further comprises at least one end, called a first end, which extends in the zone of the upper face of the substrate configured to be outside the cavity.

14. The inlay according to claim 1, wherein the inlay additionally comprises at least one second zigzag portion disposed, at least in part, in the zone of the upper face of the substrate configured to form the spotface of the cavity.

15. The inlay according to claim 14, wherein the connection wire is additionally configured to join together at least the at least one first zigzag portion and the at least one second zigzag portion.

16. A method for producing an electronic document, comprising:
making available a body of the electronic document, the body including at least:
an inlay having at least one substrate and at least one first zigzag portion formed of a metal wire embedded in an upper face of the at least one substrate, the at least one first zigzag portion including, alternately, rectilinear segments and bends, a bend connecting two successive rectilinear segments, at least one of the rectilinear segments of the at least one first zigzag portion being disposed, at least in part, in a zone of the upper face of the substrate configured to form a spotface of a cavity of the electronic document, and the inlay including a connection wire configured to join together at least the rectilinear segments of the at least one first zigzag portion; and
at least one upper layer which covers the upper face of the substrate of the inlay, and a lower layer, the substrate of the inlay being disposed between the at least one upper layer and the lower layer; and
forming the cavity in the body including at least machining at least the at least one upper layer of the body by way of a machine tool, the machine tool having a cutting direction forming an angle of between 80° and 100° with respect to a rectilinear segment of the at least one first zigzag portion.

17. The method according to claim 16, wherein forming the cavity in the body further comprises forming a deep part of the cavity, a zone of the upper face of the substrate being configured to form the deep part of the cavity is machined.

18. The method according to claim 17, wherein a second end of the at least one of the rectilinear segments of the at least one first zigzag portion is then cut by the machine tool.

19. The method according to claim 17, wherein an end of a part of the connection wire disposed next to the at least one first zigzag portion is then cut by the machine tool.

20. An electronic document comprising:
a body including:
a cavity hollowed out in a part of a thickness of the body, the cavity comprising a deep central part and a peripheral part, formed of a spotface, less deep than the deep central part and surrounding the deep central part, and
an inlay comprising at least one substrate and at least one first zigzag portion formed of a metal wire embedded in an upper face of the substrate, the at least one first zigzag portion comprising, alternately, rectilinear segments and bends, a bend connecting two successive rectilinear segments, the at least one first zigzag portion forming a connection pad, exposed on the spotface, and the inlay comprising at least one connection wire joining together the rectilinear segments of the at least one first zigzag portion; and
a module inserted into the cavity and having at least one connection terminal being in electrical contact with the at least one first zigzag portion of the inlay.

* * * * *